United States Patent [19]

Mourou et al.

[11] 4,431,914

[45] Feb. 14, 1984

[54] PHOTOELECTRON SWITCHING IN SEMICONDUCTORS IN THE PICOSECOND TIME DOMAIN

[75] Inventors: Gerard Mourou, Rochester; Steven L. Williamson, Henrietta, both of N.Y.

[73] Assignee: The University of Rochester, Rochester, N.Y.

[21] Appl. No.: 296,721

[22] Filed: Aug. 27, 1981

[51] Int. Cl.³ .................... H01J 40/14; H01J 31/50
[52] U.S. Cl. ..................... 250/211 J; 250/213 VT
[58] Field of Search .............. 313/537; 250/211 J, 250/213 VT, 211 R, 213 R

[56] References Cited

U.S. PATENT DOCUMENTS

| | | | |
|---|---|---|---|
| 3,798,453 | 3/1974 | McIlwain et al. | 250/213 VT |
| 3,805,058 | 4/1974 | Glaenzer | 250/211 J |
| 3,887,810 | 6/1975 | Skaggs | 250/213 VT |
| 3,917,943 | 11/1975 | Auston | 250/211 J |
| 4,327,285 | 4/1982 | Bradley | 250/213 VT |

*Primary Examiner*—David C. Nelms
*Assistant Examiner*—Jere Brophy
*Attorney, Agent, or Firm*—Martin LuKacher

[57] ABSTRACT

Picosecond switching of electric current in response to optical signals is obtained by conversion of the optical signal, such as an optical pulse, into a photoelectron burst (a photoelectronic signal) which is a faithful temporal replica of the optical signal. Electron optics increase the energy of the electrons of the photoelectronic signal which is imaged so as to illuminate essentially the entire gap formed between electrodes on a body of semiconductor material. The photoelectrons are absorbed in the semiconductor material to create throughout the gap a degenerate layer. The gap geometry and the image formed by the optical signal on a photocathode, which provides the photoelectronic signal, are such that space charge effects do not distort the photoelectronic signal and a temporal replica of the optical signal illuminates the entire gap. The gap geometry affords broad bandwidth operation. Due to the gain in the system, the high photoelectron energy obtainable after electron acceleration permits the use of large band gap semiconductor materials which have high dielectric strength and are not prone to thermal breakdown effects. By deflecting the photoelectrons across a plurality of side-by-side gaps on the semiconductor, extremely high speed demultiplexing of extremely high frequency optical signals (in picosecond samples) can be obtained.

32 Claims, 6 Drawing Figures

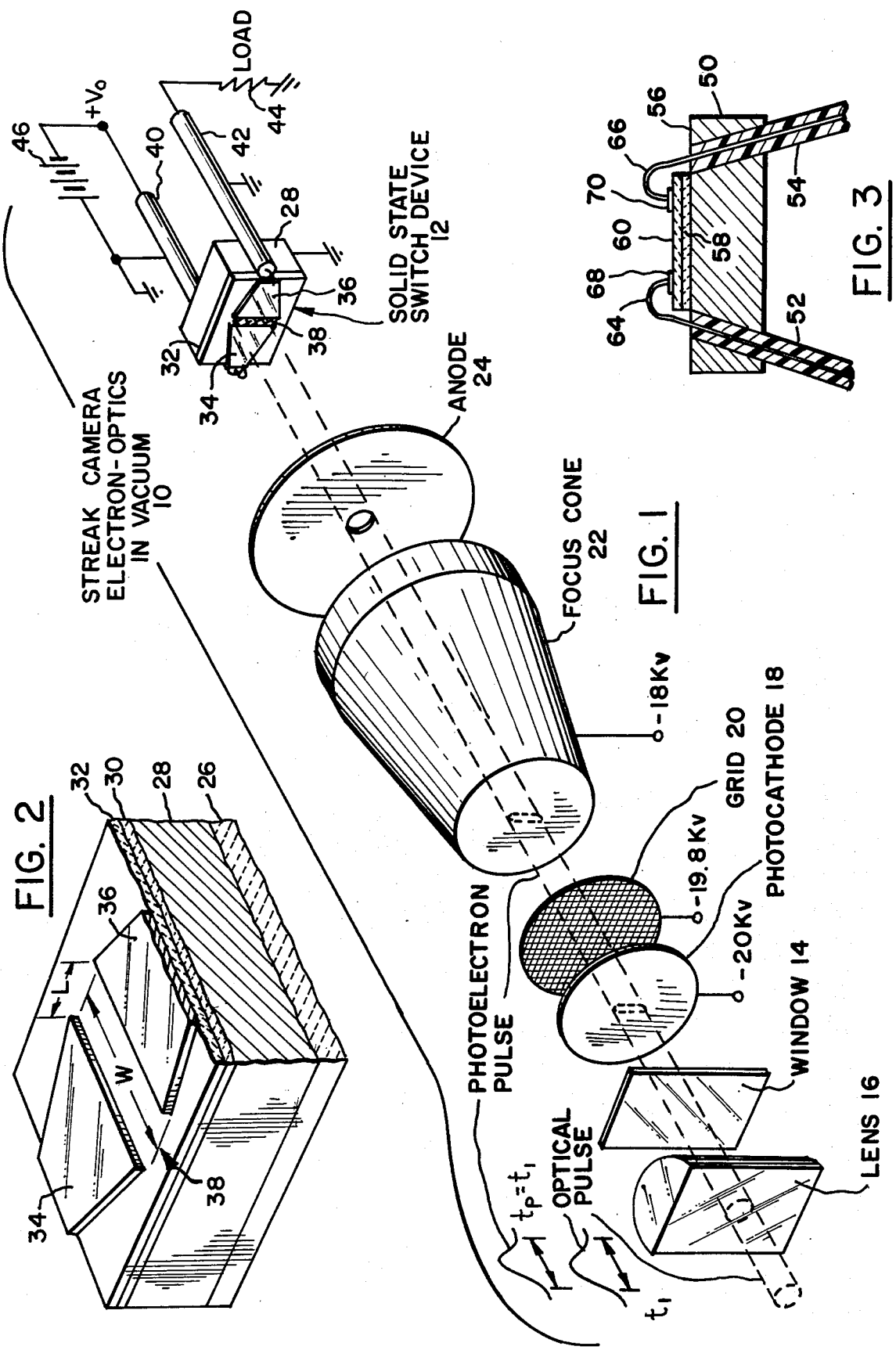

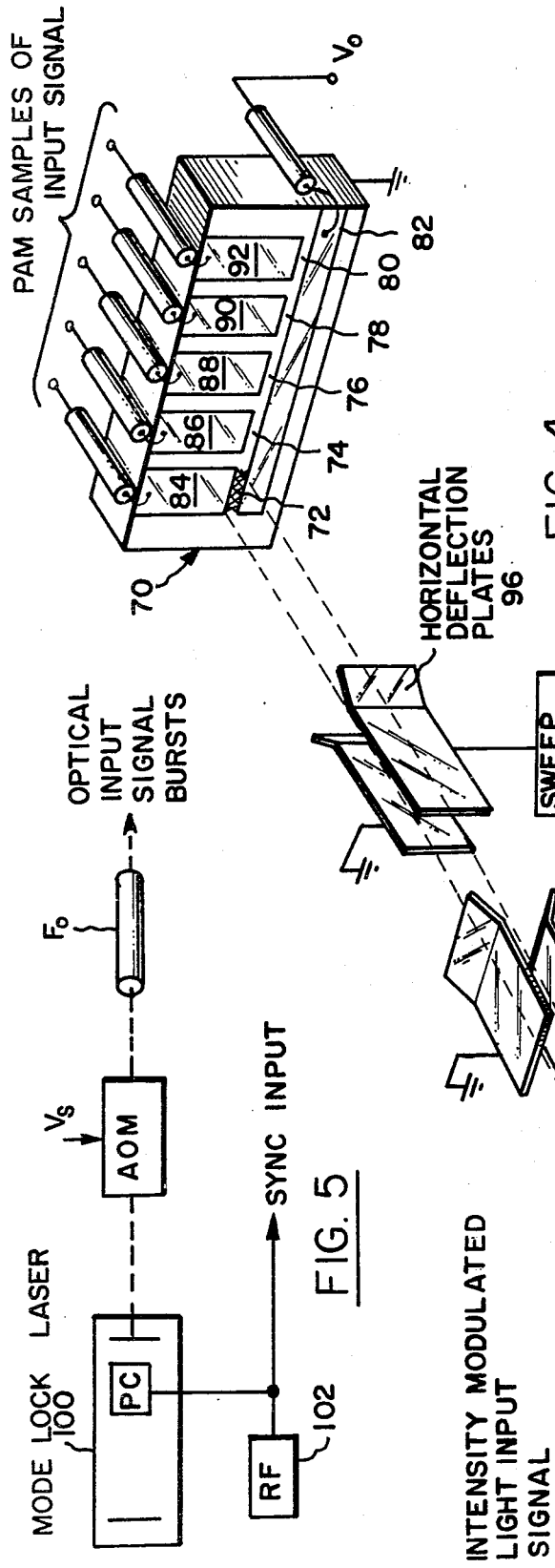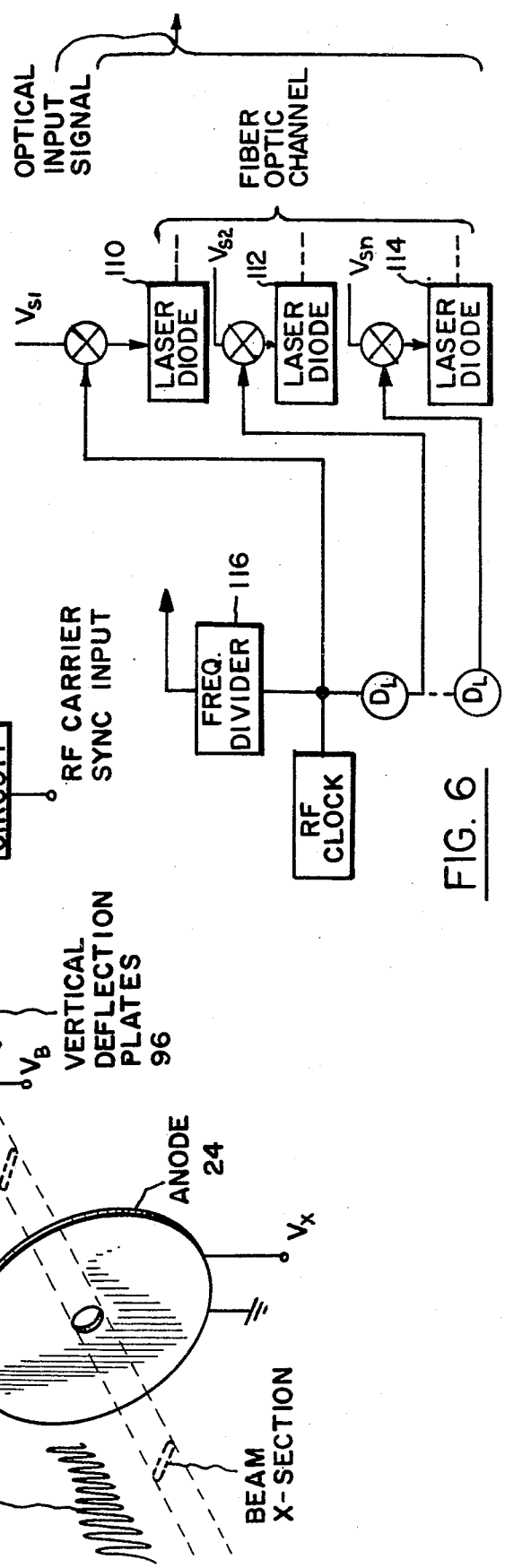

PHOTOELECTRON SWITCHING IN SEMICONDUCTORS IN THE PICOSECOND TIME DOMAIN

DESCRIPTION

The present invention relates to the switching of electric current in response to optical stimuli in semiconductors and particularly to photoelectron switching in bulk semiconductors with photoelectron replicas of optical signals.

The invention makes possible switching of electrical current in the picosecond time domain with high sensitivity. Optical signals insufficient to cause photoconductive switching are sufficient to effect switching in picoseconds, as well as control of the current, so as to enable picosecond samples corresponding in amplitude to the stimulus optical signal intensity. In other words, low energy optical signals that are insufficient to cause total switching, photoconductivity, in a semiconductor are sufficient for switching with this invention as well as control of the current (partial switching), so as to enable picosecond samples corresponding in amplitude to the optical signal intensity. Picosecond photoelectron switching makes use of photoelectrons produced at a photocathode of a picosecond photoelectron image converter in a manner to obtain picosecond switching in bulk semiconductors.

Electron bombarded semiconductor devices have been proposed which utilize semiconductor PN or Schottky diodes. Multiple electron-hole pairs are created by the high energy electrons which are incident on a surface of the diode. These electron-hole carriers drift with an applied electric field across the junction and establish current flow through the junction. Due to the time required for the carriers to drift under the influence of the electric field to the output contact of the diode, and also due to the relatively high capacitance of the junction, switching times are in the nanosecond time domain. Such semiconductor diode switches have been sold by the Watkins-Johnson of Palo Alto, Calif. The principle of operation of such switches are described in articles by R. I. Knight and D. J. Bates entitled "High Voltage Modulator Electron Bombarded Semiconductor (EBS) Devices" and "Characteristics Capabilities of the Modulator EBS" both published by Watkins-Johnson Company. The principles of photoelectron emission in response to optical pulses and their use in establishing conductivity in diodes is also discussed in Smith and Honda, *Applied Optics*, Vol. 12, No. 7, p. 1606, July 1973 and Chevalier and Nussli, *C.R. Acad. Sci. Paris*, T.264, p. 462-Series B (February 1967).

Photoconductive switching in bulk semiconductors, although capable of providing picosecond switching of electric currents, has certain drawbacks. Semiconductor materials used may, unless precautions are taken, be subject to thermal breakdown or runaway effects, particularly at high electric fields as are produced by high voltages in the kilovolt range across the gaps between electrodes on the semiconductors (See, G. Mourou, U.S. Pat. No. 4,218,618, issued Aug. 19, 1980 and U.S. patent application, Ser. No. 96,711, filed Nov. 21, 1979, now U.S. Pat. No. 4,301,362, issued Nov. 17, 1981). The sensitivity of photoconductively switched bulk semiconductors is relatively low, since only one electron-hole carrier pair is released per photon. Increased sensitivity may be obtained by designing the semiconductor switch to operate in an avalanche breakdown mode (see, G. Mourou, U.S. patent application Ser. No. 160,351, filed June 17, 1980 now U.S. Pat. No. 4,331,891 issued May 25, 1982). Such devices, however, have switching rise times which are longer than devices using direct, photoconductive switching.

Accordingly it is an object of the present invention to provide improved methods and systems for switching electric current in response to optical signals within durations in the picosecond time domain.

It is another object of the present invention to provide improved methods and apparatus for switching electrical currents with solid state devices.

It is a further object of the present invention to provide improved methods and apparatus for picosecond switching of electric current with photoelectrons.

It is a still further object of the present invention to provide improved methods and apparatus for photoelectron switching of electrical current in response to an optical stimulus in bulk semiconductors and within the picosecond time domain.

It is a still further object of the present invention to provide improved methods and apparatus for switching in semiconductors with much greater sensitivity in terms of the intensity of an optical stimulus which results in switching than is the case with photoconductive switching in semiconductors.

It is a still further object of the present invention to provide improved methods and apparatus for switching with said state materials which avoids thermal runaway, breakdown effects.

It is a still further object of the present invention to provide improved methods and apparatus for optically stimulated switching in semiconductors which can switch electrical currents at higher power than is the case in other optically actuated semiconductor switches.

It is a still further object of the present invention to provide improved methods and apparatus for switching high power with semiconductors in the picosecond domain and in response to wide bandwidth or picosecond duration optical pulses.

It is a still further object of the present invention to provide improved methods and apparatus for sampling or demultiplexing signals in a picosecond sequence.

It is a still further object of the present invention to provide improved methods and apparatus for demultiplexing an optical signal into corresponding PAM (pulse amplitude modulated) electrical signals.

Briefly described, switching of electric current in response to an optical path in accordance with the invention is accomplished by converting the optical signal, which may be an optical pulse of duration in picosecond time domain, (e.g., 20 to 100 picoseconds) into a photoelectronic signal. A photocathode may be used for the purpose of converting the optical stimulus into photoelectrons. These photoelectrons are accelerated to an energy equal to or greater than the band gap energy of a body of semiconductor material in which the current is to be switched. This body may be a bulk semiconductor, for example intrinsic silicon, chromium (Cr) doped gallium arsenide (Cr:GaAs) or other semi-insulating semiconductors. Because of the acceleration of the photoelectrons to high energy levels, a semiconductor having a large band gap with a high dielectric strength which is not affected by thermal breakdown, may be used. Such semiconductors are capable of carrying and switching large currents and are operating at high voltages (high power switching). In order to provide for picosecond switching, essentially the entire gap between electrodes on the body of semiconductors is illuminated by the photoelectrons. This may be accomplished by imaging the optical signals into a spatial pattern similar to the gap geometry which then is converted to a photoelectron replica completely irradiating the gap area (viz., a spatial, photoelectron replica of the gap on the semiconductor body). The photoelectron replica is then accelerated and focused on the gap. So long as essentially the entire gap between the electrodes is illuminated with photoelectrons of energy greater than the band gap energy, a degenerate layer is formed throughout the gap in picoseconds thereby enabling picosecond switching. Inasmuch as insulators may be rendered conductive by this process, the term, semiconductor, includes such insulators.

By providing a plurality of side-by-side gaps on the semiconductor and deflecting the photoelectrons so as to be incident on different gaps at different times, different switching elements can be activated in a picosecond sequence. Control of the photoelectron energy and the bias voltage across the gaps provides for operation in the linear region (the conductivity of the gaps will vary linearly with intensity of the photoelectronic signal, and therefore with the optical signal which is a temporal replica thereof). Accordingly, demultiplexing of the optical signals into PAM electrical signals may be obtained.

The foregoing and other objects, features and advantages of invention, as well as presently preferred embodiments thereof and the best known mode of practicing the invention, will become more apparent from a reading of the following description in connection with the accompanying drawings in which:

FIG. 1 is a perspective view schematically showing a system for switching electric current in response to an optical signal within the picosecond time domain, in accordance with the invention;

FIG. 2 is a fragmentary, perspective view of the solid state switching device which is used in the system shown in FIG. 1;

FIG. 3 is a sectional view showing another switching device which may be used in the system in FIG. 1;

FIG. 4 is perspective view partially showing a system for switching in a picosecond sequence so as demultiplex an input optical signal, which system is provided in accordance with the invention; and FIGS. 5 and 6 are block diagrams schematically showing systems for generating optical input signals which may be demultiplexed by the use of the system shown in FIG. 4.

Referring more particularly to FIG. 1 there is shown the electron optics of a streak camera contained in a evacuated (high vacuum) enclosure 10 with a solid state switch device 12 at the rear end thereof, approximately in the same position as would be located the phosphor screen of the streak camera. The front or forward end of the enclosure is provided with a window 14 through which an optical signal is transmitted. This signal may be an optical pulse of duration (FHWM-full width half maximum-$t_1$-) in the picosecond domain, for example, 20 picoseconds. The optical signal may be in the form of a beam of circular cross section. The beam is imaged by a lens 16. The lens is a cylindrical lens which provides a generally rectilinearly shaped image at a photocathode 18. It is preferred that a high efficiency photocathode be used, for example a cesium-antimony ($Cs_3Sb$) photocathode. The selection of the photocathode depends upon the wavelength of the optical signals and the operating conditions to which the system is to be put. For example in a system requiring replacement of the solid state switch device 12, it may be desired to use a photocathode which is not so subject to contamination as a cesium photocathode. Gold may be used as a photocathode under such circumstances. However, gold is not preferred because of its low quantum efficiency.

The streak camera electron optics is especially preferred since it is designed to be capable of producing a spatial and temporal replica of the optical image on the photocathode. The electron optics used in this system are a grid 20, suitably 100 mesh, a focusing cone 22 and an anode 24. All of these electro optical components, the photocathode 18 and the switch device 12 are located coaxially with each other on the axis of the optical beam. The electron optics may be the same as used to conventional streak cameras, for example, of the picotron type which has been manufactured by several concerns, such as RCA Corporation.

The solid state switch device 12 is provided in a broad bandwidth geometry. A microstrip configuration is shown and is presently preferred. However, coaxial broad band geometries may be suitable. Such geometries are described in the above referenced Mourou Patent. Referring to FIG. 2 as well as to FIG. 1, the device 12 has a substrate 26 of insulating material, such as glass or sapphire. A member or strip 28 of aluminum on the substrate provides a gound plane. An insulator 30, such as a film of insulating material such as glass, may be placed on or evaporated on the upper face of the conductive member 28. A body 32 of semiconductor material defines the upper face of the device. The body may be a wafer of semiconductor material. The semiconductor may be grown on the glass insulator film 32. It is a feature of this invention that many semiconductor materials may be used because of the large amount of photoelectron energy available.

Photoelectrons are capable of generating a large number of hole-electron pairs when they bombard a semiconductor. The number of carriers generated is equal to the photoelectron energy after amplification in the electron optics divided by the mean energy necessary to create hole-electron pair. In the case of intrinsic silicon this mean energy is 3.6 electron volts (eV). Thus for example, when the electron optics is operated to accelerate the electrons with a potential of 20 kilovolts (kV) as is illustrated in the exemplary voltage numbers given in FIG. 1, one photoelectron leads to the creation of just under 6,000 hole-electron pairs. The photoelectrons penetrate the surface of the semiconductor only a few micrometers (um) since there is a significant photoelectron energy loss per unit length of semiconductor, for example, approximately 3 keV per um. It is desirable where a wafer of crystalline semiconductor is used that it be cleaved along a plane to provide the exposed face in which contamination is reduced. Other techniques such as ion etching may be used to reduce contamination. In some cases electron bombardment before actual operation may be carried on to clean the surface of the semiconductor.

On the semiconductor, there are disposed electrodes 34 and 36 which define a gap 38. The edges of the electrodes 34 and 36 are opposed to each other and separated by the length of the gap (l). The width of the gap (w) along the edges of the electrodes is preferably longer than the length (l) such that the gap is rectilinearly shaped.

When the gap 38 is essentially entirely illuminated, the photoelectrons create a copious amount of hole-electron carrier pairs sufficient to create throughout the gap a degenerate layer. No time is wasted for the carriers to drift. Electrical current can flow across the gap through the semiconductor in picoseconds. The broad bandwidth geometry is completed by coaxial cables 40 and 42 which are connected to the electrodes 34 and 36. One of these cables is connected to ground through a load shown as a resistor 44. A bias voltage $+V_o$ indicated as being supplied by a battery 46 (DC bias) is applied across the gap 38. The broad bandwidth geometry restricts to a minimum the time delays in the system, thereby reducing system delays and facilitating picosecond switching.

The picosecond optical pulse creates a dense photoelectron packet. This packet is subject to space charge distortion of the temporal characteristic of the photoelectronic signal. This distortion is in the form of pulse width broadening, and it increases with the density of the electrons in the photoelectron packet. Temporal replication of the optical pulse should be preserved in order to insure picosecond switching.

Space charge distortion is obviated by increasing the width of the gap and providing a gap which is of length (l) much shorter than its width (w). The density of photoelectrons in the packet is thereby reduced and space charge distortion, which can change the temporal shape of the photoelectronic signal, is avoided. Inasmuch as the streak camera electron optics tends to provide a faithful, spatial as well as temporal replica of the optical signal, an optical image may be formed on the photocathode 18 which is of the same spatial characteristics as the gap 38 in the device 12. A rectilinearly shaped pattern may be obtained through the use of the cylindrical lens 16. The photoelectron replica of the pattern is then accelerated and illuminates the gap 38. Accordingly, the switching speed of the system is obtained by means of essentially, entirely illuminating the gap and by determining the spatial characteristics of the photoelectron beam to avoid space charge disturbance. It will be appreciated that a photoelectron beam confined to the gap is preferred. However, the improvement in switching speed due to essentially entire illumination of the gap can be obtained through the use of photoelectron beams which have a cross section larger than the gap which overlaps the electrodes 34 and 36.

The gap length (l) is limited by the dielectric strength of the semiconductor. The gap should be small to maximize switching power by increasing the carrier density subject to the limitation of the material's dielectric strength. The gap size is also determined by the bias voltage ($L = V_o/E_{cr}$, where $E_{cr}$ is the dielectric strength or critical field of the semiconductor). The gap geometry is also constrained by the broad bandwidth which is desired. The capacitance presented by the device should be as low as possible. The rectilinearly shaped gap affords low capacitance and broad bandwidth operation.

While a lens is shown as the means for imaging on the photocathode a light pattern of desirable spatial characteristics, other lens systems and even masks may be used to optically shape the image.

FIG. 3 illustrates another embodiment of the switch device which has the advantage of being self-supporting in the enclosure 10. The device includes a body of conductive material such as a metal or aluminum block 50. The block is drilled with two inclined holes through which semi-rigid coaxial cables 52 and 54 are inserted and encapsulated. A force fit may be used. The center conductors of the cables extend above the top surface 56 of the aluminum block 50. A film 58 of insulating material, such as a glass sheet which may be very thin (e.g. 200 um) is placed on top of the block 50; the block 50 serving as a ground plane for a microstrip geometry. A semiconductor wafer 60 is disposed on the top of the film 58. Spring clips 64 and 66 which extend from the center conductors of the cables 52 and 54 to electrodes 68 and 70, contact the electrodes and serve to clamp the wafer 60 and the film 58 to the aluminum block 50. The semi-rigid cables 52 and 54 may be used to support the device as well as to carry current which is switched by the device.

Because of the large photoelectron energy which is available, materials having a high dielectric strength and accompanying large band gap energy may be used. The advantage of using such materials is the avoidance of thermal breakdown and runaway and the ability to handle large voltages which may be applied across the device. The disadvantage is that the photoelectron gain is lower than with other materials. In silicon, the energy required for each electron hole carrier pair to be generated is 3.6 eV in the equation given above for carrier generation. In other semiconductor materials, such diamond, which can be used, the energy required for carrier generation is much larger. The photoelectron energy available still enables copious amounts of carriers to be generated and the development of a degenerate layer throughout the gap 38 which enables efficient electrical current switching to be obtained. Other materials which may be used in addition to diamond are semi-insulating semiconductors, amorphous intrinsic silicon as well as insulators.

It is desirable to use, fast recovery material such a chromium doped gallium arsenide (Cr:GaAs) for fast recovery time in the switch device 12. Such fast recovery time semiconductor materials are desirable for use in the demultiplexing switch 70 used in the system shown in FIG. 5. Inasmuch as the recovery time of most amorphous semiconductors and insulators is in the picosecond time domain, the device 12 can as well be used as a fast, sensitivity enhanced photodector.

FIG. 4 only shows part of the system. The anode 24 of the electron optics is shown. The front end of the system ahead of the anode 24 may be the same as shown in FIG. 1. The system may be used with an intensity modulated light or optical input signal. The modulation may be on a carrier as shown by the waveform at the left in FIG. 4. The optical system provides a rectilinear shaped optical and photoelectron beam (in cross-section), but turned 90 degrees from the beam as shown in FIG. 1. This is because the gaps 72, 74, 76, 78, and 80 are rectilinearly shaped but horizontally oriented, as viewed in FIG. 4.

The device 70 is similar to the device shown in FIG. 2 up to the semiconductor material which faces the incoming photoelectron beam. The electrodes on the face of the semiconductor are a horizontal common electrode 82 and plurality of vertical electrodes 84, 86, 88, 90 and 92. These electrodes form the gaps 72, 74, 76, 78 and 80 which are in side-by-side relationship. The switch device is disposed in the drift region of the electron optics. Of course, as shown in FIG. 1, the device 70 as well as the photocathode and the electron optics are disposed in the evacuated enclosure. Coaxial cables, the outer shells of which are grounded, are connected to the electrodes. A bias voltage $V_o$ may be applied to the electrode 82 and output signals may be obtained across different load resistors (not shown) from the coaxial cables which are connected to each of the other electrodes. It is desirable that the device 70 operate in the linear mode, that is the conductivity of the semiconductor material should vary linearly with the optical signal intensity. This may be accomplished by selecting the bias voltage $V_o$ and the electron energy (i.e. the accelerating voltage $V_x$ on the anode 24 and on the other electron optical elements.

Also disposed in th drift region after the anode 24, are the vertical deflection plates 94 and horizontal deflection plates 96. The vertical deflection plates may be operated at a bias voltage $V_B$ to maintain the plane of the electron beam to the horizontal plane of all of the gaps 72-80. A deflection voltage from a sweep drive circuit 98 is applied to the horizontal deflection plate and deflects the beam successively, and at close to light speed, across the gaps 72-80. Inasmuch as each gap is entirely illuminated and the space charge distortion is eliminated by the spatial characteristics of the photoelectron beam, picosecond switching occurs and samples of the optical signals, in electrical form, (PAM samples), are obtained at the outputs of the system. In order to repeatedly sample, the sweep drive circuit 98 may be synchronized with a repetitive component of the optical input signal. This may be a RF signal driving mode locked laser diodes. In the event that the optical signal arrives in bursts the burst frequency may serve as the sync input.

FIG. 5 shows a mode locked laser having a pockels cell (PC) operated by an RF source 102. The information signal $V_s$ modulates the light beam via an acousto-optical modulator (AOM), such as a birefringent crystal, the birefringence of which is voltage variable by the signal $V_s$. This signal is transmitted, for example, by an optical fiber (FO). The optical signal from the fiber is imaged, as by a lens 16 on the photocathode of the system. The RF signal may be used to provide a sync input. Accordingly, successive sweeps or deflections will occur in synchronism with each burst. It will be observed that it is much more efficient to deflect the electron beam than it would be to deflect an optical signal. Much more power is needed for optoelectronically deflecting a light beam, for example, with an electrically variable birefringent crystal (e.g. a lithium niobate crystal).

Another system for generating optical input signals which may be demultiplexed by the system shown in FIG. 4 is shown in FIG. 6. This system includes laser diodes 110, 112 and 114. There is one laser diode for each information channel. The information signals $V_{s1}$ through $V_{sn}$ are mixed with radio frequency clock signals which are successively delayed such that the output signals from the laser diodes are time division multiplexed. The optical signals are combined into a fiber optic channel for transmission at the output of the channel. These signals are demultiplexed by the system shown in FIG. 4. In order to synchronize the demultiplexing process, the frequency of the RF clock is divided by n in a frequency divider 116. The switch device 70 is provided with n gaps. On each deflection, therefore, n PAM samples are produced. The sweep time may be equal to the n delays. Since the sweep is linear, the samples will correspond to the signals which are multiplexed by the arrangement shown in FIG. 6.

From the foregoing description it will be apparent that there has been provided improved methods and apparatus for solid state switching in the picosecond time domain. Switching and multiplexing systems have been described. The system, as shown in FIG. 1, may also be used for switching out a laser pulse from a mode-locked train of laser pulses. This can be accomplished by gating the photoelectron signal at grid 20 by changing the polarity of the field between the photocathode and grid until the desired optical pulse arrives at the photocathode. This polarity change causes unwanted photoelectrons to be retained on the photocathode. Such a change in grid voltage can be accomplished with the use of threshold sensitive transistors receiving electrical pulses from a laser-activated photodetector. Such an avalanche transistor chain is commonly used to reliably select electrical pulses from a train of pulses increasing in amplitude in order to trigger a high voltage switch (kryton). This high voltage pulse, in turn, drives a Pockels Cell to gate out a single optical pulse from a train of pulses. In this new scheme the solid state switching device 12 is used directly to switch the Pockels Cell thereby avoiding the use of a kryton and eliminating the jitter inherent in such a device. Variations and modifications of the herein described embodiments, within the scope of the invention, will undoubtedly suggest themselves to those skilled in the art. Accordingly, the foregoing description should be taken as illustrative and not in a limiting sense.

We claim:

1. The method of switching electric current in response to an optical signal which comprises the steps of converting said optical signal into photoelectrons which constitute a photoelectronic signal, accelerating the photoelectrons to an energy equal or greater than the band gap energy of a body of semiconductor material having a gap defined between electrodes, illuminating essentially the entire gap between the electrodes on said body of semiconductor material to enable, within a duration in the picosecond time domain, the flow of electric current through said body between said electrodes.

2. The method according to claim 1 wherein said converting step is carried out to convert said photoelectronic signal into a temporal replica of said optical signal.

3. The method according to claim 2 wherein said converting step is carried out by changing the spatial characteristics of said optical signal to conform spatially to said gap.

4. The method according to claim 2 wherein said converting step is carried out by imaging said optical signal to provide an optical image upon a photocathode which spatially corresponds to the shape of said gap.

5. The method according to claim 4 wherein said imaging is carried out by focusing said optical signal with the aid of a lens to produce said optical image upon said photocathode.

6. The method according to claim 5 wherein said gap has a length and a width, said length being between said electrodes across said gap, and said width being the distance along said electrodes over the width of said gap, said length being shorter than said width, and said focusing step is carried out to produce an image corresponding identically in width, length and orientation to the width, length and orientation of said gap.

7. The method according to claim 1 wherein said acceleration and illuminating step is carried out by electroptically imaging said photoelectrons upon said body in said gap.

8. The method according to claim 7 comprising the step of locating said body in a region wherein said photoelectrons drift without acceleration.

9. The method according to claim 8 wherein said body has a plurality of electrodes which define a plurality of said gaps, and further comprising the steps of deflecting said photoelectrons in said drift region to be incident upon different ones of said gaps at different times.

10. The method according to claim 1 including the step the step of providing said body with the same semiconductor material throughout.

11. The method according to claim 10 wherein said material is selected from the group consisting of intrinsic crystalline silicon, amorphous intrinsic silicon, Cr: doped GaAs, and diamond.

12. The method of claim 10 including the step of providing said material with a band gap energy higher than the energy of the photons of said optical signal.

13. The method according to claim 9 wherein said optical signal has a repetitive component, and said deflecting step is carried out repeatedly in synchronism with the repetitive component of said optical signal.

14. A system for switching electric current in response to an optical signal within the picosecond time domain which comprises means for converting said optical signal into photoelectrons which constitute a photoelectronic signal, a solid state device having a body of semiconductor material, electrodes defining a gap exposing said body of semiconductor material, means for accelerating the photoelectrons to an energy equal or greater than the band gap energy of said semiconductor material and illuminating essentially the entire gap with said photoelectrons to enable the flow of electric current through said body between said electrodes within said picosecond time domain.

15. The invention as set forth in claim 14 wherein said converting means comprises means for producing said photoelectronic signal as a temporal replica of said optical signal.

16. The invention as set forth in claim 15 further comprising means connected to said electrodes for deriving said electric current with a waveform which is a temporal replica of said optical signal.

17. The invention as set forth in claim 16 wherein said replica providing means comprises means for controlling said accelerating means, and means for applying a bias voltage across said gap sufficient to allow the resistivity of said body in said gap to vary linearly with time.

18. The invention as set forth in claim 15 wherein said converting means comprises a photocathode and means for imaging said optical signal upon said photocathode to provide said photo electrons in a pattern which is a spatial replica of said gap.

19. The invention as set forth in claim 18 wherein said imaging means comprises a lens.

20. The invention as set forth in claim 19 wherein said electrodes are disposed to define said gap with a length between said electrodes, and a width being the distance along said electrodes over of said gap, said length being shorter than said width, and said lens has a curvature which produces an image having a length and width identical to said length and width of said gap.

21. The invention as defined in claim 20 wherein said gap is generally rectilinear in shape and said lens is a cylindrical lens.

22. The invention as set forth in claim 14 wherein said converting means and said accelerating and illuminating means comprises the photocathode and electron optics of a streak camera.

23. The invention as set forth in claim 14 wherein said converting mean comprises a photocathode, and said accelerating and illuminating means comprises a grid, a focus cone and an anode coaxially arranged and spaced in the order named from said photocathode, and said device is spaced from said anode along the same axis as said photocathode, grid, cone and anode.

24. The invention as set forth in claim 14 wherein said converting means comprises a photocathode and said accelerating and illuminating means comprises electro-optic means between said photocathode and said device.

25. The invention as set forth in claim 24 wherein said device comprises a member of conductive material having a planar face, said body being a wafer disposed with one side in insulating relationship upon said face, said electrodes being disposed on the side of said wafer opposite to said one side, said electrodes having edges opposed to each other to define said gap, said edges being of a width (w) longer than the length (l) between said electrodes.

26. The invention as set forth in claim 25 further comprising semi-rigid coaxial cables embedded in and extending through said member to said face thereof, said cables having conductors disposed along opposite edges of said wafer, and means connecting said conductor of one cable to one of said electrodes and the conductor of the other of said cables to the other of said electrodes for making contact with said electrodes and clamping said wafer against said member.

27. The invention as set forth in claim 24 wherein said body has a plurality of electrodes which define a plurality of said gaps in side-by-side relationship, said electro-optic means including means for deflecting said photoelectrons to be incident upon different ones of said gaps.

28. The invention as set forth in claim 27 further comprising means for repetitively deflecting said photoelectrons over said gaps, said optical signal having a repetitve component and means for synchronizing said each repeated deflection with a repetitive component of said optical signal.

29. The invention as set forth in claim 14 wherein said body consists of semiconductor material selected from the group consisting of semi insulating, amorphous semiconductors, intrinsic silicon, Cr: doped GaAs, amorphous intrinsic silicon and diamond.

30. The invention as set forth in claim 14 wherein said material is characterized by a band gap energy much higher than the energy of the photons of said optical signal.

31. The invention as set forth in claim 14 wherein said body is constituted of material which is normally insulating and has a recovery time in the picosecond time domain.

32. The invention as set forth in claim 31 wherein said material which is normally insulating is amorphous.

* * * * *